United States Patent [19]

Kasai et al.

[11] Patent Number: 4,694,497

[45] Date of Patent: Sep. 15, 1987

[54] AUTOMOTIVE MULTI-SPEAKER AUDIO SYSTEM WITH AUTOMATIC ECHO-CONTROL FEATURE

[75] Inventors: Junichi Kasai, Yokohama; Hiroshi Imai, Yokosuka; Hiroshi Tsuda, Yokohama, all of Japan

[73] Assignee: Nissan Motor Company, Limited, Yokohama, Japan

[21] Appl. No.: 844,680

[22] Filed: Mar. 27, 1986

Related U.S. Application Data

[62] Division of Ser. No. 796,974, Nov. 12, 1985.

[30] Foreign Application Priority Data

Apr. 20, 1985 [JP] Japan ............................... 60-85222

[51] Int. Cl.⁴ .............................................. H03G 3/00
[52] U.S. Cl. ....................................... 381/63; 381/56; 381/17
[58] Field of Search .................. 381/17, 24, 61, 62, 381/63, 18, 56, 58

[56] References Cited

U.S. PATENT DOCUMENTS 4,404,427  9/1983  Blackmer ........................... 381/17

Primary Examiner—Forester W. Isen
Attorney, Agent, or Firm—Schwartz, Jeffery, Schwaab, Mack, Blumenthal & Evans

[57] ABSTRACT

An automotive audio system separates audio signals from an audio signal source into first and second components. The first component of the audio signal is sent directly to a first main amplifier through a first audio signal path and reproduced through a main speaker or speakers. On the other hand, the second component of the audio signal is sent to a second main amplifier through a second audio signal path. An echo system is provided with the second audio signal path, which echo system induces echos in the audio sound to be reproduced through the second main amplifier. The echo system is associated with a discriminator circuit which receives an audio signal output from the audio signal source and derives an echo system control signal on the basis of the audio signal. The echo signal control signal is fed to the echo system for controlling operation of the echo system.

10 Claims, 11 Drawing Figures

AUTOMOTIVE MULTI-SPEAKER AUDIO SYSTEM WITH AUTOMATIC ECHO-CONTROL FEATURE

CROSS-REFERENCE TO THE RELATED APPLICATION

The present application is a continuation-in-part of co-pending U.S. patent appliction Ser. No. 796.974, filed on Nov. 12, 1985, entitled AUTOMOTIVE MULTI-SPEAKER AUDIO SYSTEM WITH DIFFERENT TIMING REPRODUCTION OF AUDIO SOUND and assigned to the same assignee as herein.

BACKGROUND OF THE INVENTION

The present invention relates generally to an automotive audio system with a plurality of speakers installed within a vehicular compartment. More specifically, the invention relates to an automotive multi-speaker audio system which can generate good audio sound for listeners in any vehicular seat within the compartment.

In modern automotive vehicles, built-in vehicle-mountable audio system, i.e. radios, magnetic tape players, compact disk players and so forth have become very popular. In addition, these automotive audio systems produce higher- and higher-quality audio sound. Various relatively high-quality, expensive systems have been developed and put on the market.

So-called ambience control systems which adjust the volumes and phases among the speakers in multi-speaker systems have recently become an additional feature. Conventional ambience control systems simply adjust the reproduction volume level at each speaker in order to control interference among acoustical vibrations in the vehicle compartment and so shift the acoustical vibration center to just above a single listener or distributing the acoustical vibration centers among multiple listeners.

Such conventional ambience control systems are commercially successful, as they provide a reasonable or at least acceptable level of audio sound. However, since such conventional ambience control systems merely control the reproduction volume, the quality of audio sound cannot be improved at all. In another approach, echo systems have been introduced in automotive audio systems to provide a better quality of sound, i.e. a better ambience. In typical automotive audio systems with such echo systems, the audio signals from an audio signal source, such as a radio, a magnetic tape recorder or a compact disk player, are separated into two components. One of the components is then sent to a mixer and the other is processed in an echo signal generator and then sent to the mixer. The mixer mixes the direct audio signal with the echo signal from the echo signal generator and sends the mixed signal to a main amplifier. Therefore, the echo signal produced by the echo signal generator is reproduced through a common main amplifier and a common speaker system with the direct audio sound. This system spoils the effect of the echo signal. In particular, in automotive audio systems, since the compartment is rather small and thus speaker or speakers are necessarily located near the listeners, echo systems in automotive audio systems have not been at all effective. Therefore, the need for higher quality audio sound and better ambience has not yet been satisfied.

Furthermore, although echos often enhance the quality of music, they make it harder to hear verbal announcements and program, such as news, conversation and so forth.

SUMMARY OF THE INVENTION

Therefore, it is a principle object of the invention to provide an automotive audio system which satisfies the requirement for higher quality audio sound and better ambience.

Another and more specific object of the invention is to provide an automotive audio system which achieves better ambience by differentiating the reproduction timing of audio signals so as to produce a deeper and wider feeling in the reproduced audio sound.

A further object of the present invention is to provide an automotive audio system which can optimize the effects of an echo system on audio sound quality and ambience.

A yet further object of the present invention is to provide an automotive audio system which controls an echo system depending upon the nature of the sound to be reproduced.

A further object of the present invention is to provide an automotive audio system which, upon recognizing audio signals other than music, disables the echo system and thereby ensures clear reproduction of non-music sounds.

In order to accomplish the aforementioned and other objects, an automotive audio system, according to the present invention, separates audio signals from an audio signal source into first and second components. The first component of the audio signal is sent directly to a first main amplifier through a first audio signal path and reproduced through a main speaker or speakers. On the other hand, the second component of the audio signal is sent to a second main amplifier through a second audio signal path. An echo system is provided with the second audio signal path, which echo system provides echo sound component for the audio sound to be reproduced through the second main amplifier. The echo system is associated with a discriminator circuit which receives an audio signal output from the audio signal source and derives an echo system control signal on the basis of the audio signal. The echo signal control signal is sent to the echo system to control operation thereof.

In the preferred operation, the discriminator discriminates audio signal between that for music and for non-music sounds.

The first and auxiliary speakers are separate and preferably located at different points in the vehicle compartment. As a result, the directly reproduced first component and the delayed second component are reproduced through different audio sound sources. This affords the listener higher-quality audio sound and better ambience.

DESCRIPTION OF THE PREFERRED EMBODIMENT

Figure 1:
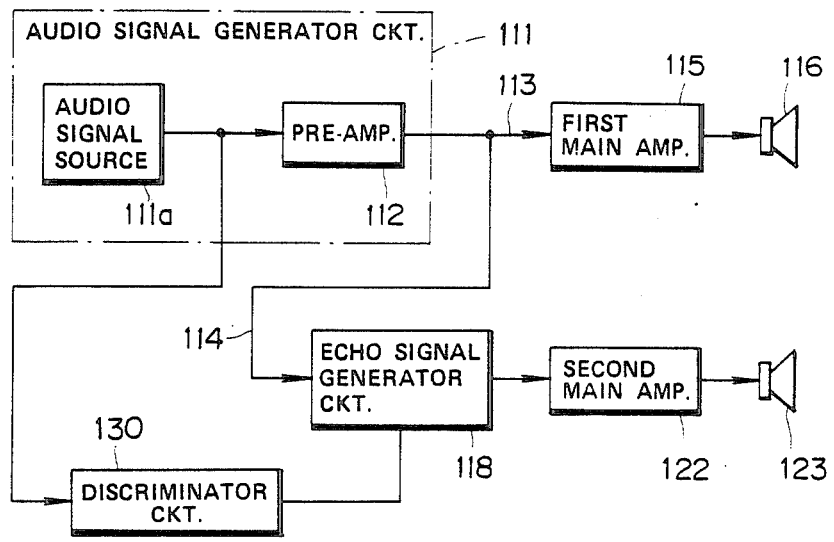
FIG. 1 is a schematic block diagram of the first embodiment of an automotive audio system according to the present invention.

Referring now to the drawings, particularly to FIG. 1, the first embodiment of an automotive audio system, according to the present invention, generally comprises an audio signal source 111a such as a radio tuner, a tape player, a compact disk player or the like, a pre-amplifier 112, a first circuit 113 including a first main amplifier 115 and a second circuit 114 including an echo signal generator 118 and a second main amplifier 122, a first speaker 116 and an auxiliary speaker 123. The first circuit 113 receives the audio signal S1 directly from the pre-amplifier 112. The first main amplifier 115 in the first circuit 113 amplifies the audio signal S1 and feeds the amplified audio signal to the main speaker 116 for reproduction. The second circuit 114 also receives the audio signal S1 from the pre-amplifier 112. The second circuit 114 includes the echo signal generator 118 which includes a first delay circuit imposing a delay time T in the range of 0.4 ms to 50 ms inclusive. The first delay circuit comprises a charge transfer device, such as a BBD, a CCD or the like.

As is well known, when identical sounds separated by a short lag time reach a listener from different directions, the direction of the sound source is recognized to be the direction of the earlier sound. This effect applies to lags of approximately 0.4 ms to 40 ms. In the case of shorter lags the sound source appears to be intermediate the earlier and later sounds. On the other hand, in the case of longer lags, the sounds are heard separately and distinctly. Also, it is well known that the apparent distance from the sound source is significantly influenced by echo. In particular, echo causes the sound source to appear to be farther than the actual distance. Therefore, by inducing an appropriate degree of lag and echo in the reproduced audio sound, the quality of the reproduced sound and the audio ambience can be improved.

The echo signal generator has been disclosed in detail in the parent U.S. patent application Ser. No. 796,974. The contents of the parent application are hereby incorporated by reference.

The output of the echo signal generator 118 is sent to an auxiliary speaker 123 through a second main amplifier 122.

Various arrangements of the speakers have also been disclosed in the parent application. It should be noted that the present invention is also applicable to automotive audio systems with any arrangement of speakers such as are disclosed in the parent application. The present invention is also applicable to various arrangements of audio speakers other than those disclosed in the parent application.

In this arrangement, the audio signal from the audio signal source 111a is transmitted to the first and auxiliary speakers 116 and 123 via the first and second circuits 113 and 114. The first audio signal component S1 transmitted through the first circuit 113 is directly reproduced by the main speaker 116 without any delay. On the other hand, the second audio signal component S2 transmitted through the second circuit 114 is delayed by a time $T_1$ by a first delay circuit. After the delay time $T_1$, the second audio signal component S2 is sent to the echo signal generator 118. In the echo signal generator 118, a further delay $T_2$ is induced by a second delay circuit. A level adjustor circuit selectively attenuates the second audio signal. By repeatedly feeding back the second audio component with the delay time $T_2$, a desired echo signal can be obtained. The echo signal is sent to the auxiliary speaker 123 via the second main amplifier 122.

As set forth above, the delay time in the second circuit 114 is set to be within the range of 0.4 msec. to 50 msec so that the listener will hear audio sound coming from a source in the direction of the main speaker 116. In addition, due to the effect of echo sound reproduced through the auxiliary speaker 123, the apparent distance to the main speaker 116 is greater than the actual distance. Furthermore, by orienting the second speaker at an angle with respect to the axis extending through the main speaker and the listener, the echo sound may be subliminally perceived as an echo from a relatively distant wall. Therefore, as will be appreciated, the ambience of the sound reproduced by the shown embodiment can be significantly improved.

As shown in FIG. 1, the first embodiment of the automotive audio system also has a discriminator circuit 130. The discriminator circuit 130 is connected for input from an audio signal source 111a upstream of the pre-amplifier 112, and for output to the echo signal generator circuit 118 in the second circuit 114.

The discriminator circuit 130 is designed to discriminate between music and non-musical speech, such as a human talking. In the case of music, it would be advantageous to generate echos in order to achieve the acoustical expansion effect described above. On the other hand, in the case of human speech, it would be better to avoid echos to ensure that the human speech can be heard clearly.

Therefore, according to the shown embodiment, the delay imposed by the second circuit 114 is adjusted according to the results of the operation of the discriminator circuit 130. Specifically, when music is detected, the delay is selected to be in the range of 10 msec. to 35 msec. On the other hand, when speech is detected, the delay time for the echo sound is adjusted to less than 10 msec. Hereafter, the delay time (i.e. 10 msec. to 35 msec.) for music will be referred to as "first delay time" and the delay time (i.e. less than 10 msec.) for speech will be referred to as "nd delay time".

The discriminator circuit 130 switches the delay time in the echo signal generator circuit 118 between the first and second delay times. Therefore, the discriminator circuit 130 outputs to the echo signal generator circuit 118 a discriminator signal which has a value variable between a first value representative of music and a second value representative of speech. The echo sound generator circuit 118 is responsive to the discriminator signal from the discriminator circuit 130 to adjust the delay time.

Figure 2:
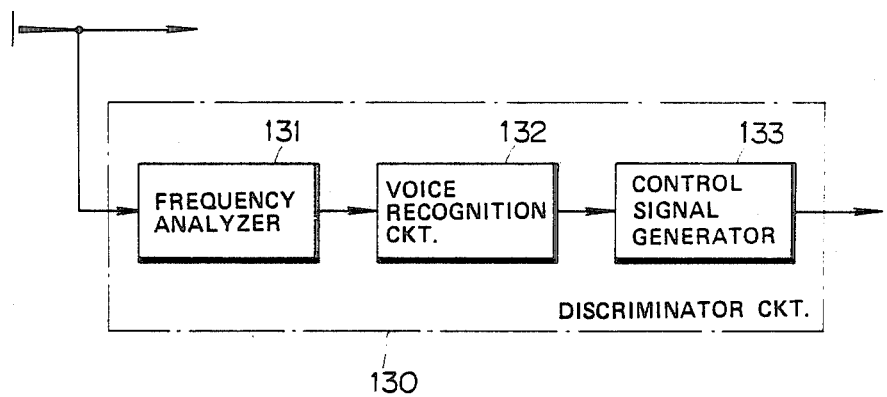
FIG. 2 is a block diagram of a discriminator circuit in the first embodiment of the automotive audio system of FIG. 1.

FIG. 2 shows one example of the discriminator circuit 130 in the shown embodiment of FIG. 1. In this example, the discriminator circuit 130 discriminates between music and speech on the basis of the frequency spectrum of the sound to be reproduced.

In order to distinguish between music and speech, there is provided a frequency analyzer 131, a speech recognition circuit 132 and a control signal generator 133. The control signal generator 133 outputs a signal serving as the discriminator signal ordering adjustment of the delay time between the first delay time and second delay time.

The frequency analyzer 131 receives the audio signal from the audio signal source, such as a CD player, a tape player, a radio tuner or the like. The frequency analyzer analyzes the audio signal frequency spectrum and outputs the result to the speech recognition circuit 132. The speech recognition circuit 132 distinguishes between music and speech on the basis of the output of the frequency analyzer 131. The speech recognition circuit 132 outputs a signal indicative of the result.

Figure 3:
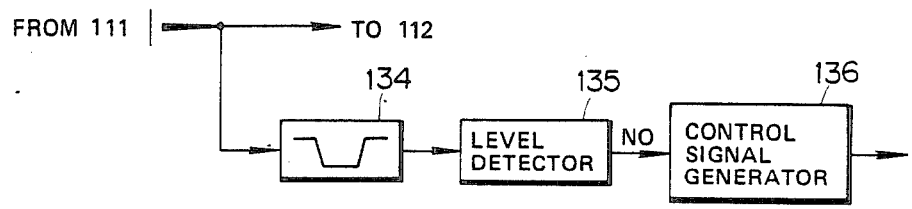
FIG. 3 is a block diagram of another embodiment of the discriminator circuit in the first embodiment of the automotive audio system of FIG. 1.

FIG. 3 shows another example of the discriminator circuit 130. In this example, a filter 134 filters out audio signal components in the speech frequency range. The filter 134 is connected to a level detector 135 which monitors the output level of the filter. The level detector 135 compares the output level of the filter 134 with a predetermined threshold. If the filter output level is higher than the threshold, then music is recognized. On the other hand, if the filter output level is lower than the threshold, speech is recognized. The detector 135 produces a detector signal having a value variable between HIGH and LOW depending on the filter output level. The control signal generator 136 is responsive to the detector signal to feed the discriminator signal to the echo signal generator 118 to switch the delay time between the first delay time and the second delay time.

Figure 4:
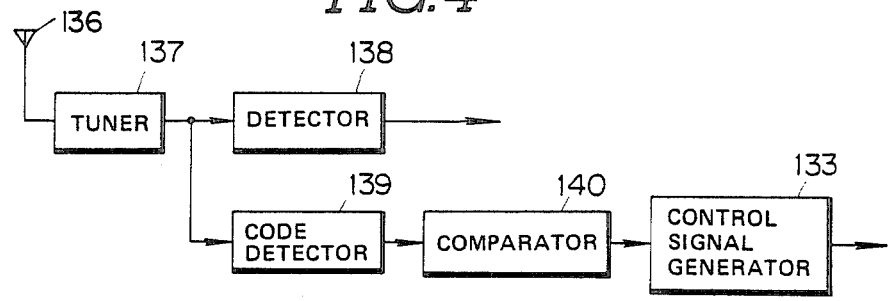
FIG. 4 is a block diagram of a further embodiment of the discriminator circuit in the first embodiment of the automotive audio system of FIG. 1.

FIG. 4 is a further example of the discriminator circuit 130 which is specifically adapted to discriminate between music and speech in audio signals from radio tuners. This example is designed to detect a program code in the broadcast signal which identifies the radio program.

The radio receiver circuit serving as the audio signal source 111 includes an antenna 136, a tuner 137 and a detector 138. A code detector 139 detects the aforementioned program code in the radio signal received from the tuner 137. The code detector 139 extracts the program code component from the radio signal and sents it to a comparator 140. The comparator 140 holds one or more program codes identifying programs such as news, weather report, traffic information and so forth. The comparator 140 compares the received code with the preset codes. The comparator 140 outputs a comparator signal variable between a HIGH and LOW level depending on the results of the comparison. The comparator signal level goes HIGH when the received program code matches the preset code. Therefore, the HIGH-level comparator signal is representative of speech. On the other hand, when the comparator signal is LOW, it represents music. The control signal generator 133 is responsive to the comparator signal to send the discriminator signal to the echo signal generator 113 for switching between the first and second delay times.

Figure 5:
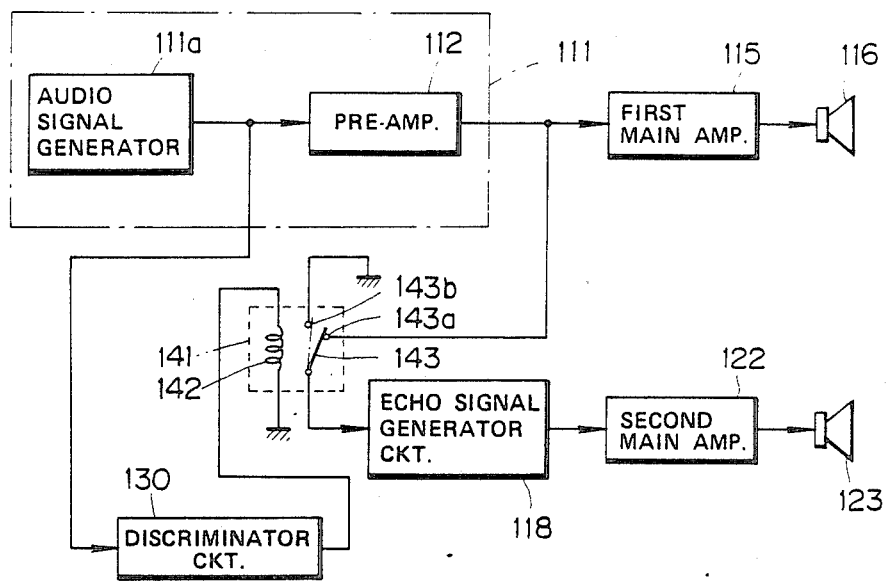
FIG. 5 is a modification of the first embodiment of the automotive audio system of FIG. 1.

FIG. 5 shows a modification to the first embodiment of the automotive audio system according to the invention. In this embodiment, a switching relay 141 is provided between the pre-amplifier 112 and the echo signal generator 118. The switching relay 141 includes relay coil 142 connected to the discriminator circuit 130.

In this modification, the discriminator circuit 130 outputs a HIGH-level discriminator signal when the audio sound to be reproduced is vocal sound and a LOW-level discriminator signal when the reproduced sound is music.

The switching relay 141 has a movable contact 143 normally in contact with a terminal 143a which is connected to the pre-amplifier 112. When the movable contact 143 is held in contact with the terminal 143a, the output of the pre-amplifier 112 is sent to the echo signal generator 118. When the relay coil 142 is energized by the HIGH-level discriminator signal from the discriminator circuit 130, the movable contact 143 moves into contact with the other terminal 143b to connect the echo signal generator 118 to ground.

Therefore, in this modification, the echo signal generator 118 is disabled during speech and thus the auxiliary speaker 123 will not reproduce sound. In this case, the speech sound is reproduced only by the main speaker without echo.

Figure 6:
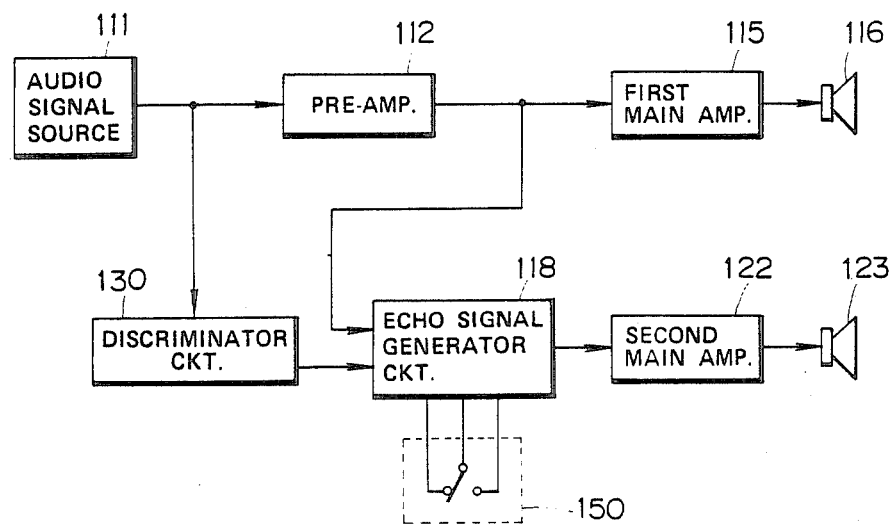
FIG. 6 is another modification of the first embodiment of the automotive audio system of FIG. 1.
Figure 7:
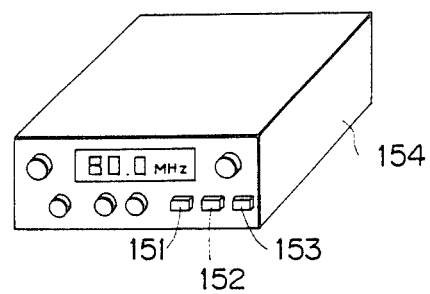
FIG. 7 is a perspective view of an amplifier to be employed in the automotive audio syste, of FIG. 6.

FIGS. 6 and 7 show another modification of the foregoing first embodiment of FIG. 1. This modification enables manual control of the echo signal generator 118. A manually operable selector switch 150 allows manual control of the echo signal generator 118. The selector switch 150 is associated with selector buttons 151, 152 and 153, which are mounted on an amplifier casing 154. The selector button 151 is adapted to be selected when listening to speech, such as news, weather reports, announcements and so forth. The selector switch 150 is responsive to depression of the selector button 151 to disable the echo signal generator 118. Alternatively, it would be possible to minimize the delay time to less than 10 msec, in response to depression of the selector button 151. The selector button 152 is to be depressed when listening to music. The echo signal generator 118 is responsive to depression of the selector button 152 to be enabled or, alternatively, to set the delay time to the given range, i.e. 10 msec. to 35 msec.

The selector button 153 is designed to select AUTO mode. When the AUTO mode is selected by depression of the selector switch 153, the echo signal generator 118 is connected to the discriminator circuit 130 to control the delay time by means of the discriminator signal.

Figure 8:
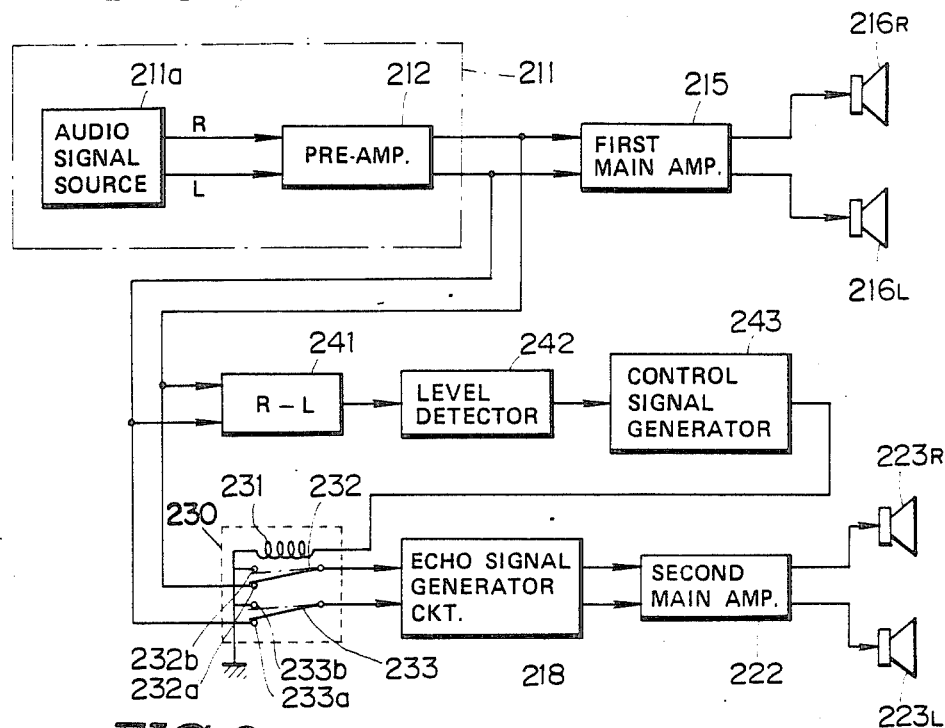
FIG. 8 is a schematic block diagram of the second embodiment of the automotive audio system according to the invention.

FIG. 8 shows a second embodiment of an automotive audio system according to the present invention. This embodiment is especially suitable for application to stereo audio systems and controls the echo signal generator in accordance with the difference in signal level between the left and right channels.

For this, the audio system is provided with left- and right-channel main speakers 216L and 216R which are connected to an audio signal source 211 through a pre amplifier 212 and a first main amplifier 215. The preamplifier 212 and the first main amplifier 215 comprises stereo amplifiers. The audio system also has left- and right-channel auxiliary speakers 223L and 223R. The left- and right-channel auxiliary speakers 223L and 223R are connected to the audio signal source 211 via the pre-amplifier 212, an echo signal generator 218 and a second main amplifier 222 which comprises a stereo amplifier.

A relay circuit 230 is connected between the pre-amplifier 212 and the echo signal generator 218. The relay circuit 230 includes a relay coil 231 and movable contacts 232 and 233 for each of the left and right channels. The movable contacts 232 and 233 normally contact the terminals 232a and 233a connected to the pre-amplifier to connect the echo signal generator 218 to the pre-amplifier. On the other hand, when the relay coil 231 is energized, the movable contacts 232 and 233 are switched to connect the echo signal generator 218 to ground.

A monaural reproduction detecting circuit controls energization and deenergization of the relay coil. The monaural sound reproduction detecting circuit comprises a substracting circuit 241, a level detector 242 and a control signal generator 243. The subtracting circuit 241 is connected to the pre-amplifier 212 to receive the left- and right-channel audio signals and derives the signal level difference therebetween. The subtracting circuit 241 outputs a signal level difference indicative signal to the level detector 242. The level detector 242 is responsive to the signal level difference indicative signal to compare the signal level with a given threshold value. In general, vocal sounds, such as news, weather reports, announcements and so forth, are reproduced monaurally. Therefore, the signal levels of the left and right channels should be equal. As a result, the difference derived by the substracting circuit 241 should be zero. Therefore, the given value in the level detector 242 will be zero.

The control signal generator 243 is responsive to the output of the level detector 242 indicative of zero difference to output a HIGH-level control signal to the relay coil 231. The relay coil 231 is thus energized to connect the echo signal generator 218 to the ground.

Figure 9:
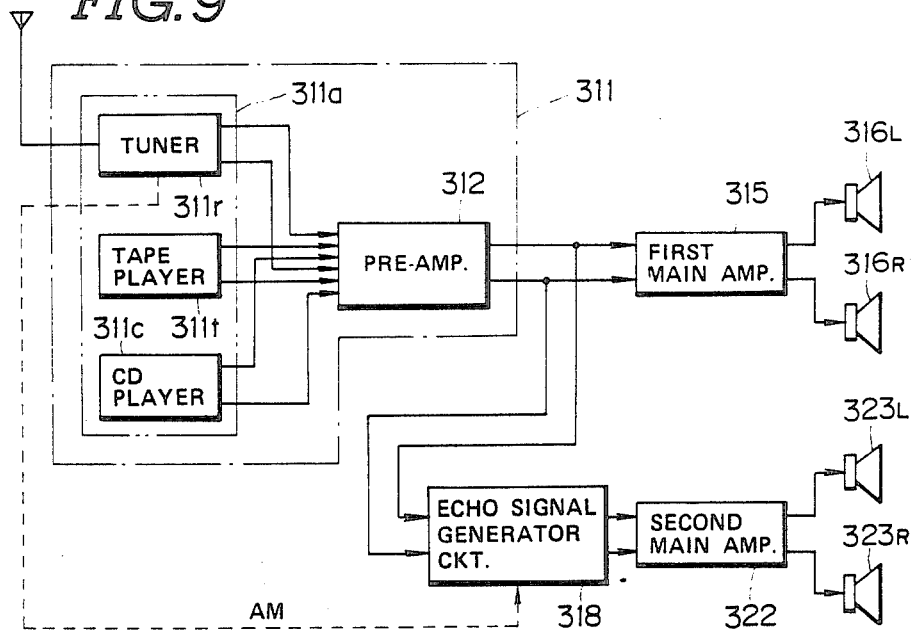
FIG. 9 is a schematic block diagram of the third embodiment of the automotive audio system according to the invention.

FIG. 9 shows the third embodiment of an automotive audio system according to the invention, in which an echo signal generator 318 is disabled when AM reception is selected through a radio tuner 311r.

In this embodiment, the radio tuner 311r, a cassette tape player 311t and a CD player 311c form the audio signal source and are selectively operable for generating audio signals. The radio tuner 311r is adapted to receive at least AM signals. As will be appreciated, the radio tuner may also receive FM signals and in this case, will have an AM/FM selector. The radio tuner 311r, the cassette tape player 311t and the CD player 311c are each connected to left- and right-channel main speakers 316L and 316R through a pre-amplifier 312 and a first main amplifier 315, and also connected to left- and right-channel auxiliary speakers 323L and 323R through the pre-amplifier 312, the echo signal generator 318 and a second main amplifier 322. The AM/FM selector in the radio tuner 311r is connected to the echo signal generator 318. The echo signal generator 318 is responsive to an AM selection indicative signal from the AM/FM selector to shorten the delay time to less than 10 msec. or, otherwise, to cease transmission of the audio signal to the second main amplifier 322 so as to stop reproduction through the auxiliary speakers 323L and 323R.

Figure 10:
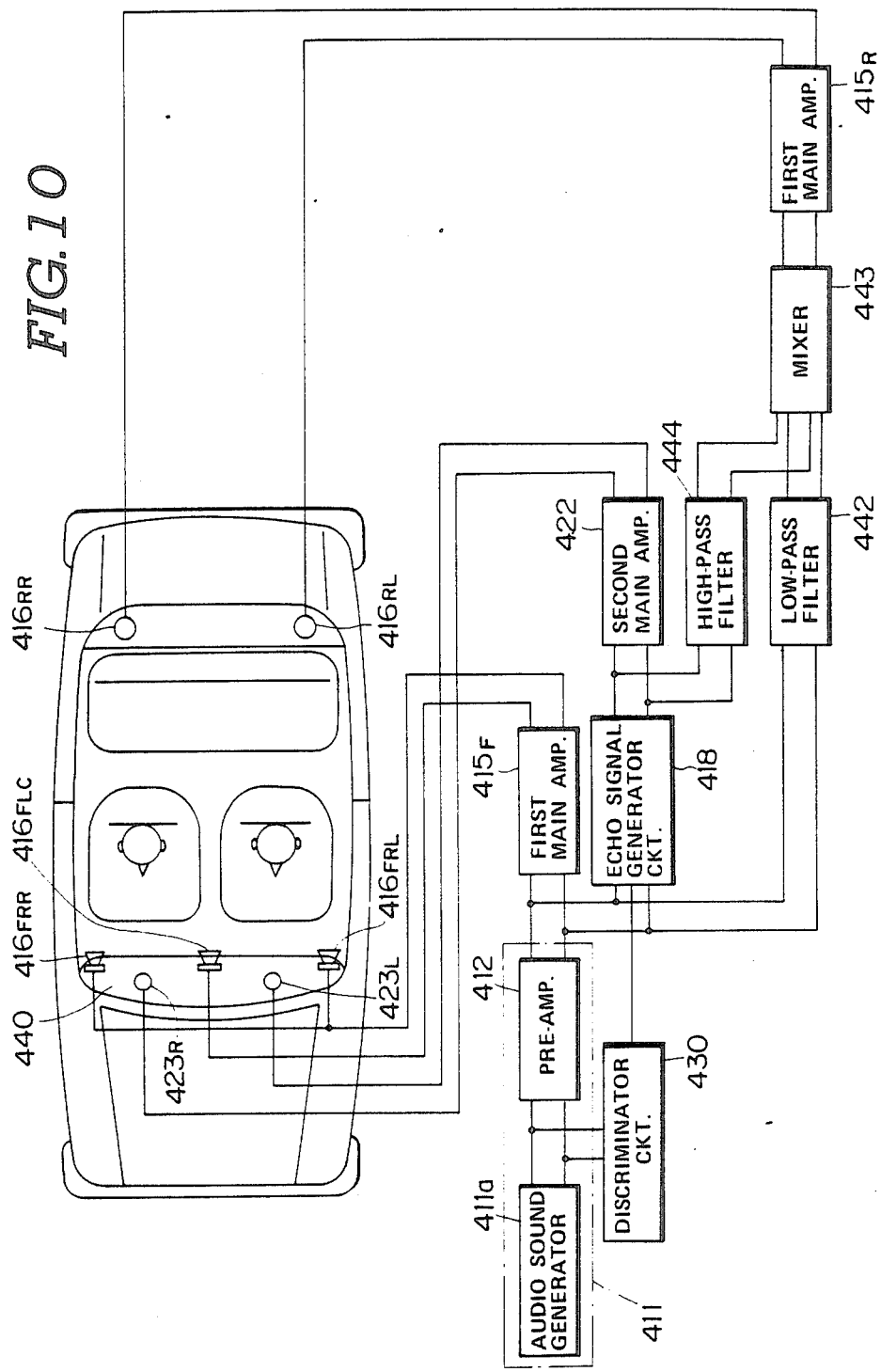
FIG. 10 is a diagram of the fourth embodiment of the automotive audio system according to the invention.

FIG. 10 shows the fourth embodiment of an automotive audio system, in which a discriminator circuit 430 operates in substantially the same manner as the discriminator circuit 130 in the first embodiment An echo signal generator 418 also operates in substantially same manner as the echo signal generator 118 in the first embodiment. Specifically, the echo signal generator 118 switches its delay time between the first delay time and the second delay time as set out with respect to the first embodiment.

The shown embodiment includes five main speakers. Among these five, three speakers 416FRL, 416FLC and 416FRR are installed on an instrument panel 410. The main speakers 416FRL and 416FRR reproduce right-channel audio sound and are installed at opposite ends of the instrument panel 440. On the other hand, the speaker 416FLC reproduces left-channel sound and is installed at the center of the instrument panel. The two remaining speakers 416RL, 416RR are installed on a rear parcel shelf 441. The main speakers 416 FRL, 416FLC and 416FRR are connected to the audio signal source 411 through a pre-amplifier 412 and a first main amplifier 415F. Similarly, the main speakers 416RL and 416RR are connected to the audio signal source 411 via the pre-amplifier 412, a low-pass filter 442, a mixer 443 and another first main amplifier 413R. A pair of auxiliary speakers 423L and 423R are also installed on the instrument panel 440. The auxiliary speakers 423L and 423R are connected to the audio signal source 411 through the pre-amplifier 412, an echo signal generator 418 and a second main amplifier 422. The echo signal generator 418 is also connected to the mixer 443 via a high pass filter.

The echo signal generator 418 is also connected to the discriminator circuit 430 to receive the discriminator signal. As set forth with respect to the first embodiment, the discriminator circuit 430 receives audio signals from the audio signal source 411 and discriminates between music and speech in the received signal. When the audio signal from the audio signal source 411 consists of music, the delay time of the echo signal generator 418 is set to the first delay time, i.e. in the range of 10 msec, to 35 msec. On the other hand, when the audio signal is speech, the delay time of the echo signal generator 418 is set to the second delay time, i.e. less than 10 msec.

In the shown arrangement, the three main speakers 416FRL, 416FLC and 416FRR directly reproduce the audio signal transmitted directly from the audio signal source 411 through the pre-amplifier 412 and the first main amplifier 415F. The mixer receives low-frequency components of the audio signal directly from the audio signal source 411 without any delay. On the other hand, the mixer 443 receives the high-frequency components through the echo signal generator 418 after the first or second delay time. Therefore, the sound reproduced through the two rear speakers 416RL and 416RR is composed of the low-frequency, directly reproduced component and the high-frequency, delayed component. This provides acoustical expansion.

As will be appreciated, the auxiliary speakers 423L and 423R also reproduce delayed echo sound for acoustical expansion for better ambience as set forth with respect to the preceding embodiments.

It should be appreciated that, while the directly transmitted, low-frequency components and the delayed, higher-frequency components are mixed in the mixer, the mixed components should not interfere mutually due to the difference in their frequency ranges. Therefore, audio sound can be reproduced clearly through the two rear main speakers 416RL and 416RR.

Figure 11:
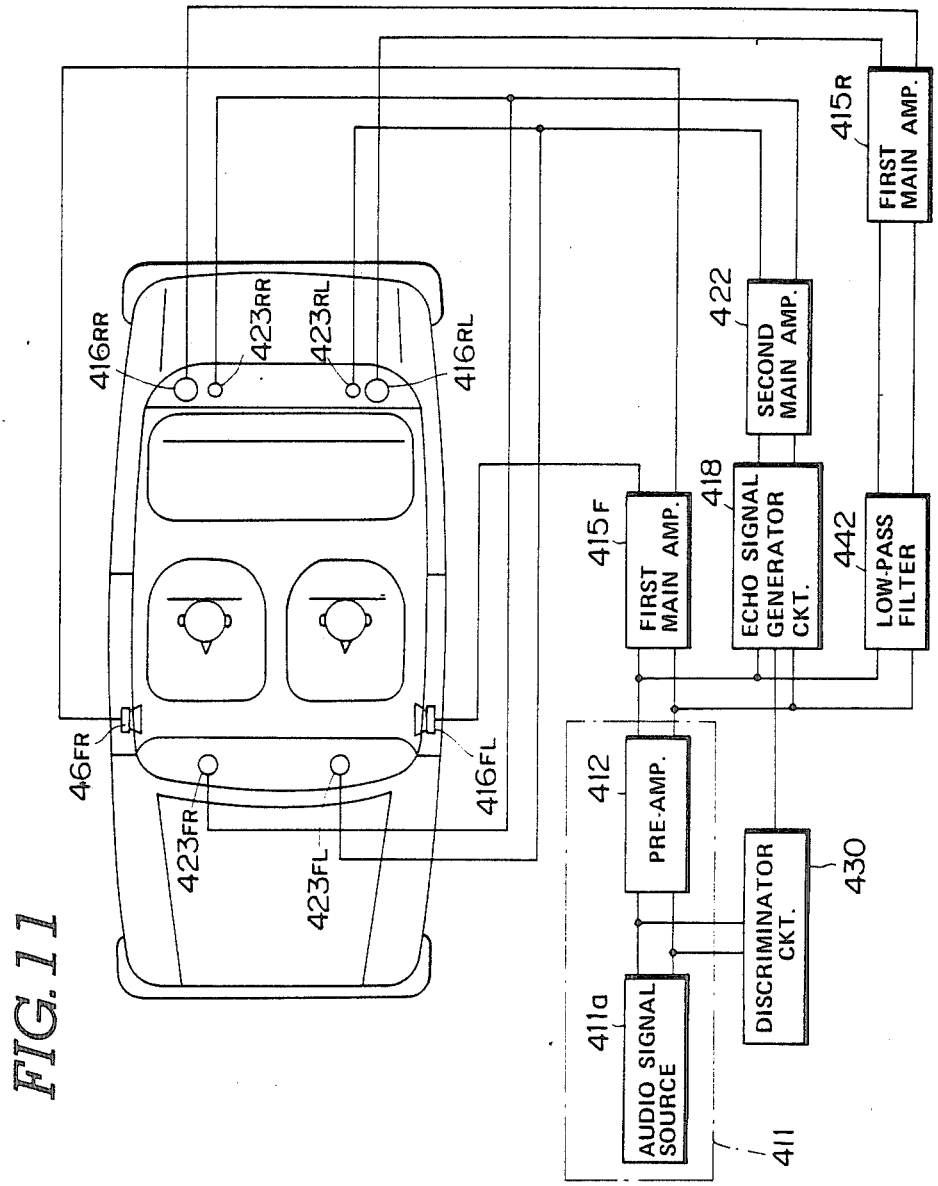
FIG. 11 is a diagram of a modification to the fourth embodiment of the automotive audio system according to the invention.

FIG. 11 shows a modification to the fourth embodiment of the automotive audio system according to the invention. This modification employs four main speakers, i.e. a left-channel front main speaker 416FL, a right-channel front main speaker 416FR, a left-channel rear main speaker 416RL and a right-channel rear main speaker 416RR. There are also four auxiliary speakers. i.e. a left channel front auxiliary speaker 423FL, a right-channel front auxiliary speaker 423FR, a left-channel rear auxiliary speaker 423RL and a right-channel rear auxiliary speaker 423RR.

The left- and right-channel rear main speakers 416RL and 416RR are connected to the audio signal source 411 via the pre amplifier 412, the low-pass filter 442 and the first rear main amplifier 415R. On the other hand, the auxiliary speakers 423FL, 423FR, 423RL and 423RR are connected to the echo signal generator 418 to receive the delayed echo sound.

In this case, the rear main speakers 416RL and 416RR comprise woofers for higher quality reproduction of bass sound.

As in the preceding embodiment, the echo signal delay time is controlled between the first and second delay times by the discriminator 430.

As will be appreciated herefrom, all of the embodiments set out above afford the listener better ambience and higher-quality audio reproduction. Therefore, the present invention fulfills all of the objects and advantages sought therefor.

While the specific embodiments have been disclosed in order to clearly disclose the invention, it should be appreciated that the invention can be embodied in various ways which differ from the shown embodiments or their modifications. Therefore, it should be appreciated that the present invention includes all possible embodiments and modifications to the shown embodiments which do not depart from the principles of the invention, which are set out in the appended claims.

What is claimed is:

1. An automotive audio system comprising:
   an audio signal source adapted to generate audio signals for reproduction;
   a first audio signal path for feeding said audio signals from said audio source to a first speaker adapted to generate a first audio sound by reproducing said audio signals;
   a second audio signal path for feeding said audio signals from said audio signal source to a second speaker independent of said first speaker and adapted to generate a second audio sound;
   a sound discriminator receiving said audio signal and discriminating between non-musical sound and musical sound for producing a discriminator signal indicative thereof; and
   an echo signal generator interposed within said second audio signal path for receiving said audio signals from said audio signal source and generating echo signals to be reproduced through said second speaker, said echo signal generator being associated with said sound discriminator and adjusting its operating level between a predetermined minimum level and a predetermined maximum level in response to said discriminator signal, said echo signal generator being adapted to generate said echo signals by inducing a delay in said audio signals from said audio signal source, and adjusting said delay in said audio signals between a first longer delay time and a second shorter delay time depending on said discriminator signal.

2. The automotive audio system as set forth in claim 1, wherein said sound discriminator is responsive to selection of AM radio to set said delay time of said echo signal generator to said second delay time.

3. The automotive audio system as set forth in claim 1, wherein said sound discriminator comprises a frequency analyzer receiving said audio signal from said audio signal source and performing frequency analysis, a speech recognition circuit for detecting specific components indicative of speech, and a control signal generator for outputting a control signal ordering adjustment of the delay between said first and second delay times, said control signal generator being responsive to said speech recognition circuit detecting speech-indicative components in said audio signal to set said delay time in said echo signal generator to said second delay time.

4. The automotive audio system as set forth in claim 1, wherein said sound discriminator comprises a band-pass filter for passing a specific audio frequency range, a level detector monitoring the output level of said band-pass filter, and a control signal generator for outputting a control signal for varying said delay time between said first and second delay times, said band-pass filter being set to a frequency range corresponding to the frequency range of human speech, and said control signal generator being responsive to output of said level detector indicative of an output level of said band-pass filter exceeding a given threshold level to set said delay time to said second delay time.

5. The automotive audio system as set forth in claim 1, wherein said echo signal generator is responsive to said sound discriminator detecting speech-indicative audio signal components to be disabled.

6. The automotive audio system as set forth in claim 3, which further comprises a manually operable switch associated with said echo signal generator for manually controlling said delay time.

7. The automotive audio system as set forth in claim 4, which further comprises a manually operable switch associated with said echo signal generator for manually controlling said delay time.

8. The automotive audio system as set forth in claim 1, wherein said sound discriminator comprises a subtraction circuit for deriving the difference between the audio signal levels of a left-channel and a right-channel of stereo audio sound, a level detector monitoring the difference indicative output of said subtracting circuit and a control signal generator responsive to an output of said level detector to set the delay time of said echo signal generator to said second delay time.

9. An automotive audio system comprising:
   an audio signal source adapted to generate audio signals for reproduction;
   a first audio signal path for feeding said audio signals from said audio source to a first speaker adapted to generate a first audio sound by reproducing said audio signals;
   a second audio signal path for feeding said audio signals from said audio signal source to a second speaker independent of said first speaker and adapted to generate a second audio sound;
   a sound discriminator receiving said audio signals and discriminating between non-musical sound and musical sound for producing a discriminator signal indicative thereof; and
   an echo signal generator interposed within said second audio signal path for receiving said audio signals from said audio signal source and generating echo signals to be reproduced through said second speaker, said echo signal generator being associated with said sound discriminator and adjusting its operating level between a predetermined minimum level and a predetermined maximum level in response to said discriminator signal, said echo signal generator being adapted to generate said echo signals by shifting phase of said audio signals from said audio signal source, and adjusting the phase shifting magnitude or said audio signals depending on said discriminator signal.

10. An automotive audio system as set forth in claim 9, wherein said echo signal generator varies said phase shift of said audio signals between a greater magnitude and a smaller magnitude depending on said discriminator signal.

* * * * *